(12) United States Patent
Lin et al.

(10) Patent No.: US 9,368,631 B2
(45) Date of Patent: *Jun. 14, 2016

(54) THIN FILM TRANSISTOR AND DISPLAY PANEL INCLUDING THE SAME

(71) Applicant: InnoLux Corporation, Miao-Li County (TW)

(72) Inventors: Hsin-Hung Lin, Miao-Li County (TW); Jung-Fang Chang, Miao-Li County (TW); Ker-Yih Kao, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/478,148

(22) Filed: Sep. 5, 2014

(65) Prior Publication Data

US 2014/0374750 A1    Dec. 25, 2014

Related U.S. Application Data

(63) Continuation of application No. 13/288,579, filed on Nov. 3, 2011, now Pat. No. 8,890,145.

(30) Foreign Application Priority Data

Nov. 17, 2010    (TW) ................................ 99139500 A (51) Int. Cl.
*H01L 21/00*       (2006.01)
*H01L 29/786*      (2006.01)
(Continued)

(52) U.S. Cl.
CPC ........ *H01L 29/78606* (2013.01); *H01L 21/441* (2013.01); *H01L 21/47* (2013.01);
(Continued)

(58) Field of Classification Search
CPC .............. H01L 29/78606; H01L 21/47; H01L 29/41775; H01L 27/1225; H01L 23/481; H01L 29/518
See application file for complete search history.

(56) References Cited

U.S. PATENT DOCUMENTS

| 8,012,794 | B2 | 9/2011 | Ye |
| 8,253,134 | B2 * | 8/2012 | Kim .................... H01L 29/7869 |
| | | | 257/43 |
| 8,890,145 | B2 * | 11/2014 | Lin ................... H01L 29/78606 |
| | | | 257/43 |

FOREIGN PATENT DOCUMENTS

| CN | 101976650 | 2/2011 |
| KR | 10-2009-0126390 | 12/2009 |

(Continued)

OTHER PUBLICATIONS

Chinese language office action dated Mar. 13, 2013.

(Continued)

*Primary Examiner* — Laura Menz
(74) *Attorney, Agent, or Firm* — McClure, Qualey & Rodack, LLP (57) ABSTRACT

Disclosed is a thin film transistor including a gate electrode on a substrate. A gate dielectric layer is disposed on the gate electrode and the substrate, and source/drain electrodes are disposed on the gate dielectric layer overlying two edge parts of the gate electrode. A channel layer is disposed on the gate dielectric layer overlying a center part of the gate electrode, and the channel region contacts the source/drain electrodes. An insulating capping layer overlies the channel layer, wherein the channel layer includes an oxide semiconductor.

14 Claims, 7 Drawing Sheets

(51) Int. Cl.
  *H01L 29/66* (2006.01)
  *H01L 27/12* (2006.01)
  *H01L 23/31* (2006.01)
  *H01L 23/48* (2006.01)
  *H01L 29/417* (2006.01)
  *H01L 29/51* (2006.01)
  *H01L 21/441* (2006.01)
  *H01L 21/47* (2006.01)
  *H01L 21/471* (2006.01)
  *H01L 21/4757* (2006.01)

(52) U.S. Cl.
  CPC ....... *H01L 21/471* (2013.01); *H01L 21/47573* (2013.01); *H01L 23/3171* (2013.01); *H01L 23/481* (2013.01); *H01L 27/1225* (2013.01); *H01L 27/1259* (2013.01); *H01L 29/41733* (2013.01); *H01L 29/41775* (2013.01); *H01L 29/517* (2013.01); *H01L 29/518* (2013.01); *H01L 29/66742* (2013.01); *H01L 29/66969* (2013.01); *H01L 29/7869* (2013.01); *H01L 2924/0002* (2013.01)

(56) References Cited

FOREIGN PATENT DOCUMENTS

KR   20090126390   * 12/2009 ............ H01L 29/786
TW   201041140      11/2010

OTHER PUBLICATIONS

Taiwanese language office action dated Aug. 7, 2013.
English language translation of abstract of KR10-2009-0126390 (published Dec. 9, 2009).
English language translation of abstract of TW 201041140 (published Nov. 16, 2010).
English language translation of abstract of CN 101976650 (published Feb. 16, 2011).

* cited by examiner

THIN FILM TRANSISTOR AND DISPLAY PANEL INCLUDING THE SAME

CROSS REFERENCE TO RELATED APPLICATIONS

This application is a Continuation of U.S. patent application Ser. No. 13/288,579, filed on Nov. 3, 2011 and entitled "Thin film transistors and methods for manufacturing the same", now U.S. Pat. No. 8,890,145, which claims priority of Taiwan Patent Application No. 99139500, filed on Nov. 17, 2010, the entirety of which is incorporated by reference herein.

BACKGROUND OF THE INVENTION

1. Field of the Invention

The present invention relates to thin film transistors, and in particular relates to methods and structures of utilizing an oxide semiconductor as channel layers of the thin film transistors.

2. Description of the Related Art

In the process of forming thin film transistors (TFT), oxide semiconductors have become a main trend for related industries in Japan and Korea. The oxide semiconductors can be zinc oxide (ZnO), gallium-doped zinc oxide (GZO), aluminum zinc oxide (AZO), zinc tin oxide (ZTO), indium zinc oxide (IZO), and indium gallium zinc oxide (IGZO), and the likes. The oxide semiconductor process may adopt a five photomask process such as a back channel etching (BCE) process or a coplanar process for an inverted gate electrode, or adopt a six photomask process such as a process utilizing an etching stop layer. The etching stop layer in the process adopting six photomasks can protect a channel layer, such that devices made thereby have performances which are better than that of the process adopting five photomasks. However, the process utilizing the etching stop layer needs an additional photomask. In the coplanar process for inverted gate electrodes adopting five photomasks, each photomask can individually define each layer of the TFT without being limited by etching selectivity. As such, panel manufacturers only need to slightly change the processes, and benefiting mass production. In the future, large area panels will combine copper metal processes with the oxide semiconductor technology. Before forming a passivation layer covering a copper metal layer, the oxide on the metal surface should be reduced to copper by plasma of reducing atmosphere (e.g. $H_2$ plasma). The oxide semiconductor is sensitive to the plasma of reducing atmosphere, and the reducing plasma may break a device made thereby.

Accordingly, a novel process without additional photomasks is called for, which efficiently protects the channel layer from damage of following processes, such as the reducing plasma process.

BRIEF SUMMARY OF THE INVENTION

One embodiment of the invention provides a method for manufacturing a thin film transistor, comprising: forming a gate electrode on a substrate; forming a gate dielectric layer on the gate electrode and the substrate; forming source/drain electrodes on the gate dielectric layer overlying two edge parts of the gate electrode; forming an oxide semiconductor layer on the source/drain electrodes and the gate dielectric layer; forming an insulating layer on the oxide semiconductor layer; and patterning the insulating layer and the oxide semiconductor layer to form an insulating capping layer covering a channel layer.

Another embodiment of the invention provides a thin film transistor, comprising: a gate electrode on a substrate; a gate dielectric layer on the gate electrode and the substrate; a source/drain electrode on the gate dielectric layer overlying two edge parts of the gate electrode; a channel layer on the dielectric layer overlying a center part of the gate electrode; and an insulating capping layer covering the channel layer, wherein the channel layer comprises an oxide semiconductor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The making and using of the TFTs in the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1A:
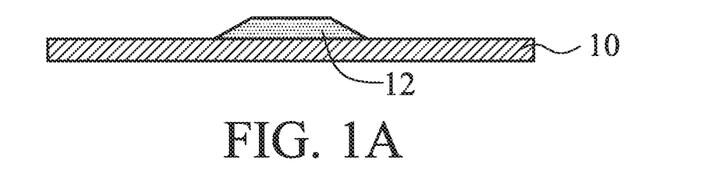
FIGS. 1A-1B, 2A-2B, 3A-3C, 4A-4D, 5A, and 6A are cross sectional diagrams depicting a process of forming a thin film transistor in some embodiments of the invention.

As shown in FIG. 1A, a patterned metal layer 12 is formed on a substrate 10. The substrate 10 comprises rigid inorganic material such as transparent material (e.g. glass, quartz, and the likes) or opaque material (e.g. wafer, ceramic, and the likes), or flexible organic material (e.g. plastic, rubber, polyester, polycarbonate, and the likes). In some embodiments, the substrate 10 adopts the transparent material, and the final TFT products can be utilized in transmissive, transflective, or reflective LCDs. In other embodiments, the substrate 10 adopts the opaque material, and the final TFT products can be only utilized in reflective LCDs or self illumination displays.

The patterned metal layer 12 can be metal, alloys, or multi-layered structures thereof. In some embodiment, the patterned metal layer 12 can be single-layered or multi-layered structures of molybdenum, aluminum, copper, titanium, or alloys thereof. The method of forming the patterned metal layer 12 includes forming a metal layer on the substrate 10, and then forming the patterned metal layer 12 by photolithography with etching. The step of forming the metal layer includes physical vapor deposition (PVD), sputtering, or the likes. The photolithography process may include processing the steps of photoresist coating, soft baking, mask aligning, exposing, post-exposure baking, developing, hard baking, other suitable steps, or combinations thereof. In addition, the exposing step of the photolithography can be replaced with other step such as maskless lithography, electron beam writing, or ion beam writing. The etching process can be dry etching, wet etching, or combinations thereof. Although the patterned metal layer 12 only serves as a gate electrode in a TFT and a gate line connecting the gate electrode in FIG. 1C, the patterned metal layer 12 may also serve as a contact pad, a bottom electrode of a storage capacitor, or other elements if necessary.

Figure 1B:
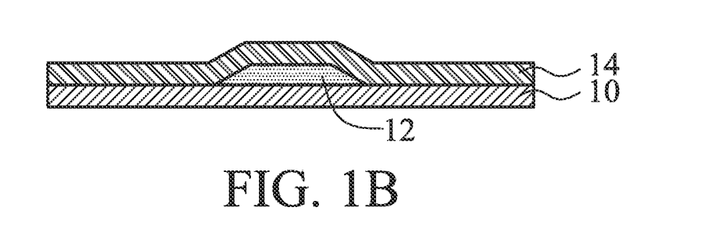
Figure 1C:
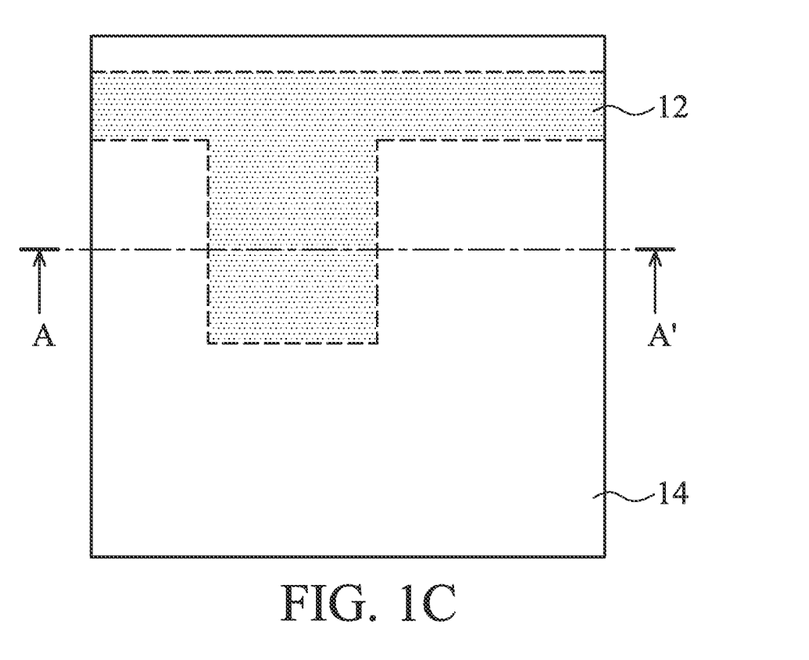
FIGS. 1C, 2C, 3D, 5B, and 6B are top views showing a process of forming a thin film transistor in some embodiment of the invention.

As shown in FIG. 1B, a dielectric layer 14 is then formed on the patterned metal layer 12. The dielectric layer 14 can be composed of organic material such as silicon-oxygen compound, or inorganic material such as silicon nitride, silicon oxide, silicon oxynitride, silicon carbide, aluminum oxide, hafnium oxide, or multi-layered structures thereof. The dielectric layer 14 can be formed by chemical vapor deposition (CVD) such as plasma enhanced CVD (PECVD), low-pressure CVD (LPCVD), sub-atmospheric CVD (SACVD), physical vapor deposition (PVD), or the likes. Although the dielectric layer 14 only serves as a gate dielectric layer in the TFT in FIG. 1C, the dielectric layer 14 may also serve as a capacitor dielectric layer in the storage capacitor or other elements if necessary. It should be understood that a cross section of the line A-A' in FIG. 1C is shown in FIG. 1B.

Figure 2A:
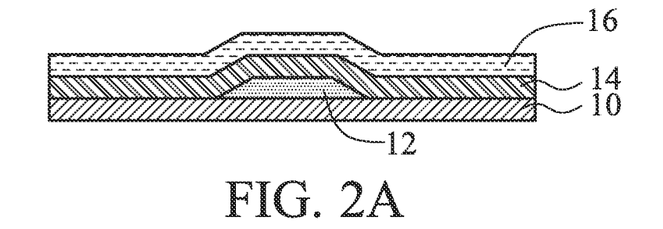

As shown in FIG. 2A, another metal layer 16 is formed on the dielectric layer 14. The metal layer 16 can be metal, alloy, or multi-layered structures thereof. In some embodiment, the metal layer 16 includes copper or copper alloy. Alternatively, the metal layer 16 is free of copper, such as a multi-layered structure of molybdenum/aluminum/molybdenum, a single-layered or a multi-layered structure of molybdenum, aluminum, titanium, or alloys thereof. The metal layer 16 can be formed by plating, electroless plating, PVD, sputtering, or the likes.

Figure 2B:
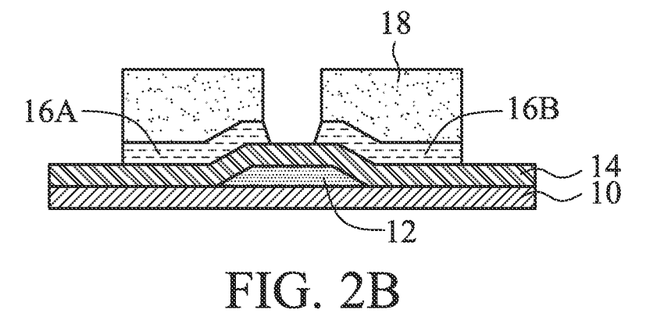
Figure 2C:
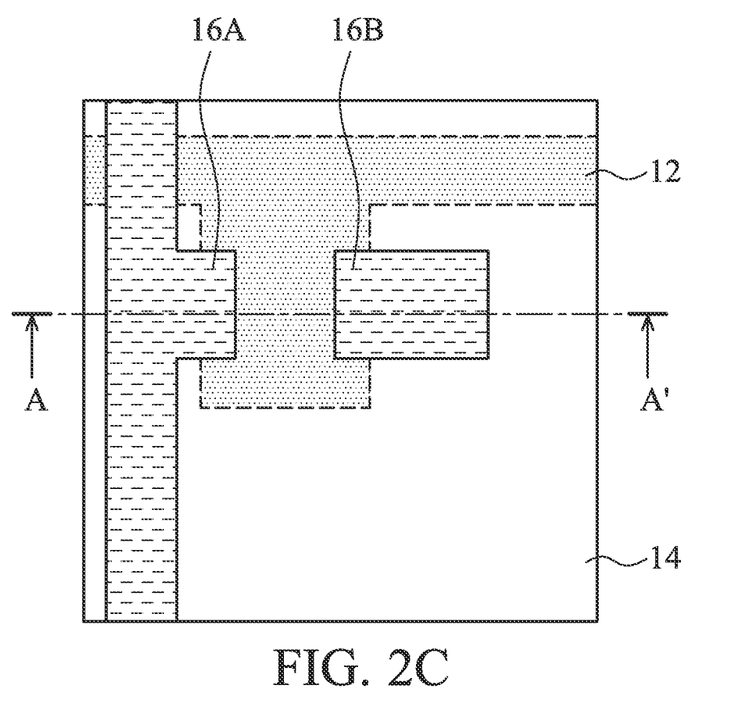

As shown in FIG. 2B, a patterned photoresist layer 18 is formed on the metal layer 16 by a photolithography process. The photolithography process is described above and omitted here. The metal layer 16 is then etched with the patterned photoresist layer 18 serving as a mask, thereby forming a source electrode 16A and a drain electrode 16B. The etching process can be dry etching, wet etching, or combinations thereof. Afterward, the patterned photoresist layer 18 is removed by a wet striper or a dry ashing process. Although the patterned metal layer 16 only serves as the source electrode 16A, the drain electrode 16B, and a source line in FIG. 2C, the patterned metal layer 16 may also serve as other lines or other elements if necessary. It should be understood that a cross section of the line A-A' in FIG. 2C is shown in FIG. 2B after the patterned photoresist layer 18 has been removed.

Figure 3A:
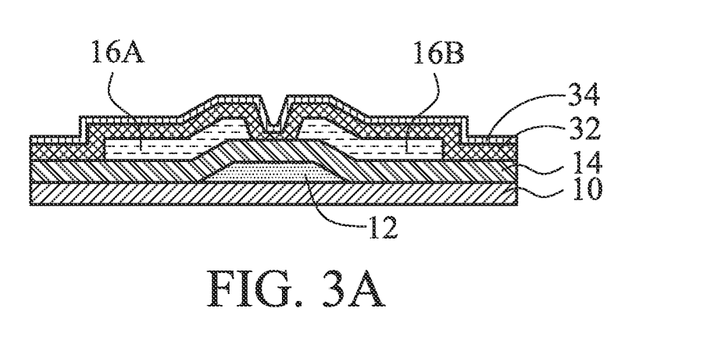

As shown in FIG. 3A, the patterned photoresist layer 18 in FIG. 2B is removed, an oxide semiconductor layer 32 is then formed on the structure in FIG. 2B without the patterned photoresist layer 18, and an insulating layer 34 is then formed on the oxide semiconductor layer 32. In one embodiment, the oxide semiconductor layer 32 can be zinc oxide, indium oxide, indium gallium zinc oxide, or tin oxide. In other embodiments, the semiconductor layer 32 is a combination of at least two compounds selected from zinc oxide, indium oxide, indium gallium zinc oxide, tin oxide, gallium oxide, aluminum oxide, and titanium oxide. The oxide semiconductor layer 32 can be formed by a CVD process such as a PECVD, LPCVD, or SACVD process, or a PVD process, solution synthesis, or the likes. In one embodiment, the insulating layer 34 can be an organic material, such as acrylic series material, which is formed by spin-on coating, slit coating, dipping, or the likes. In another embodiment, the insulating layer 34 can be an inorganic material, such as silicon oxide, silicon nitride, silicon oxynitride, aluminum oxide, titanium oxide, hafnium oxide, or aluminum nitride, which is formed by a sputtering, or CVD process such as a PECVD, LPCVD, or SACVD process, or the likes. In other embodiments, the insulating layer 34 is composed of a passivated metal layer such as aluminum oxide, titanium oxide, titanium nitride, or other oxidized or nitrided metal layer. The method of forming the passivated metal layer first forms a metal layer on the oxide semiconductor layer 32, and then passivates the metal layer by oxygen or nitrogen. Note that not all of the passivated metal layers can serve as the insulating layer 34. For example, both the aluminum oxide and aluminum nitride are insulating materials, such that aluminum can be passivated by oxidizing or nitriding. Otherwise, titanium oxide is an insulating material but titanium nitride is still a conductive material, such that the titanium is passivated by oxidizing not nitriding. The above processes should be performed at an isobaric condition such as in a vacuum. In one embodiment, the steps of forming the oxide semiconductor layer 32 and the insulating layer 34 are performed in a same reaction chamber. In other embodiments, the steps of forming the oxide semiconductor layer 32 and the insulating layer 34 are performed in different reaction chambers of an isobaric system.

Figure 3B:
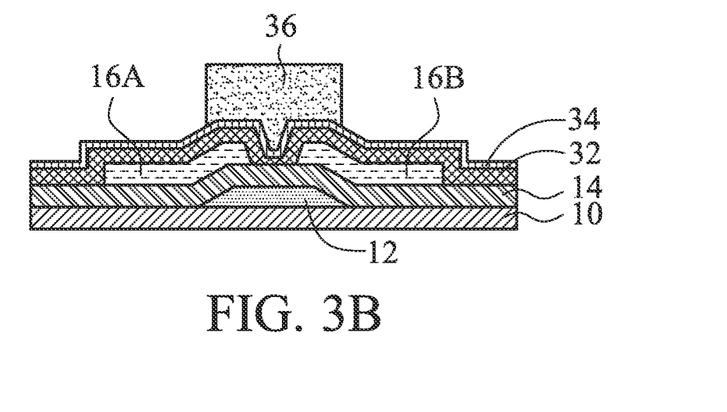

As shown in FIG. 3B, a patterned photoresist layer 36 is formed on the insulating layer 34 by a photolithography process. The photolithography process is described above and omitted here. Subsequently, the insulating layer 34 and the oxide semiconductor layer 32 not covered by the patterned photoresist layer 36 are removed by a single step etching process, thereby forming an insulating capping layer 37 covering the channel layer 38. The single step etching process can be a dry etching process utilizing a mixture gas of alkane, hydrogen, argon, halogen acid, and the likes, or a wet etching process utilizing hydrofluoric acid. Thereafter, the patterned photoresist layer 36 is removed to obtain the structure as shown in FIG. 3C.

Figure 3C:
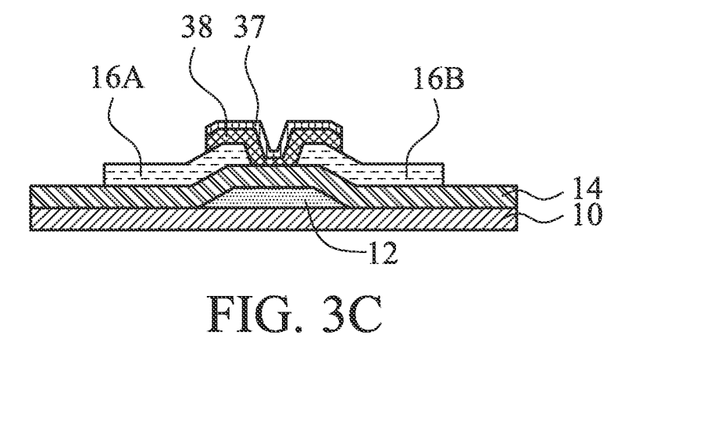
Figure 3D:
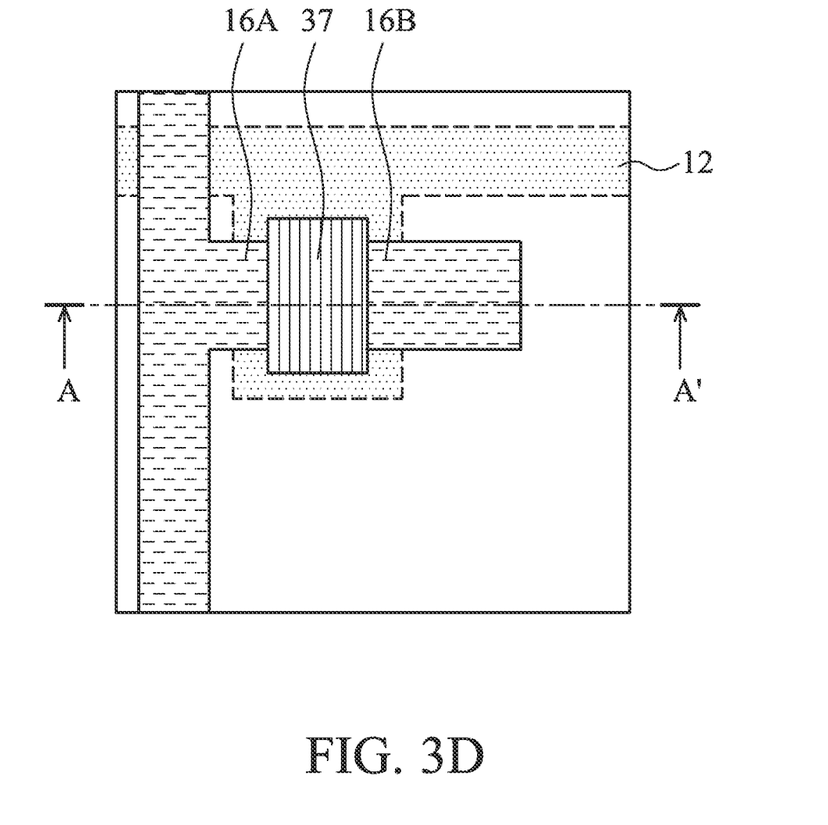
Figure 4A:
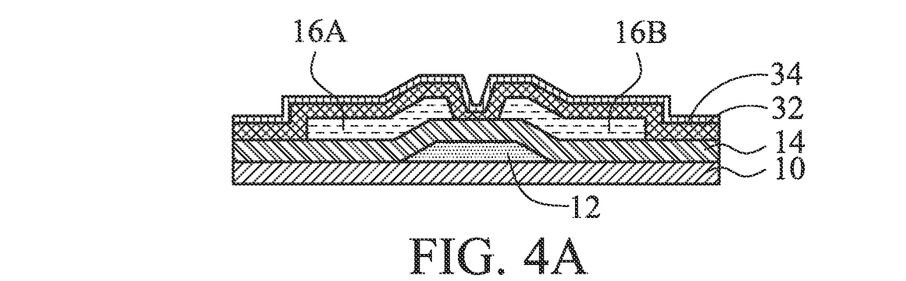
Figure 4B:
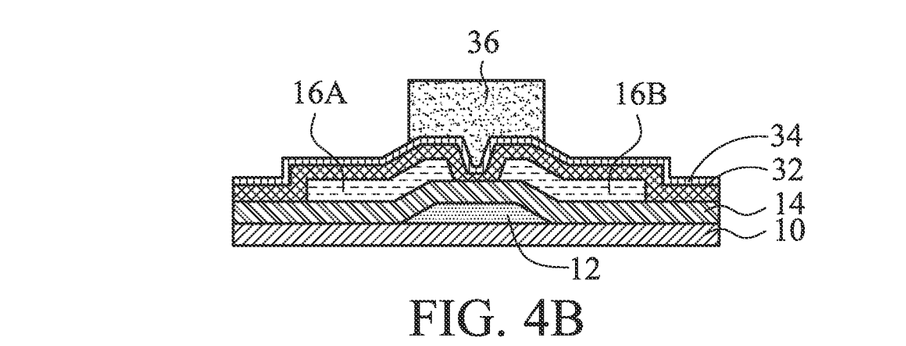
Figure 4C:
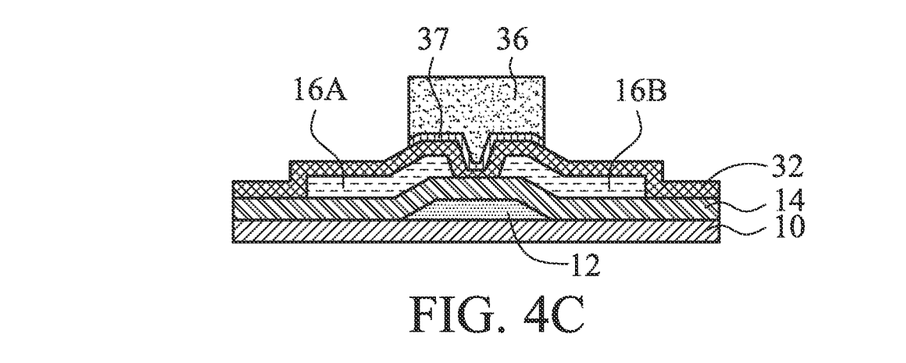
Figure 4D:
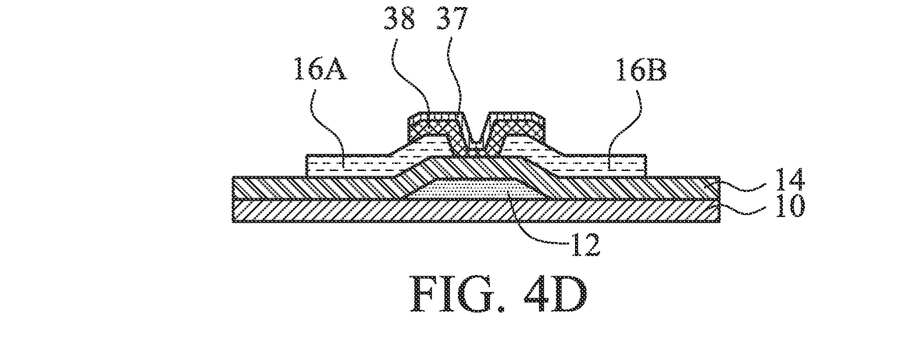

The processes in FIGS. 4A-4D are similar to the processes in FIGS. 3A-3C, and the only difference therebetween is the insulating capping layer 37 and the channel layer 38 being formed by a multi-step etching process in FIGS. 4A-4D rather than the single step etching in FIGS. 3A-3C. For example, the insulating layer 34 not covered by the patterned photoresist layer 36 is firstly removed to form the insulating capping layer 37 as shown in FIG. 4C. The removal is performed by a first step etching process. Thereafter, the oxide semiconductor layer 32 not covered by the patterned photoresist layer 36 is removed to form the channel layer 38. The removal is performed by a second step etching process. The patterned photoresist layer 36 is then removed as shown in FIG. 4D. Corresponding to the selectivities of the oxide semiconductor layer 32 and the insulating layer 34, the first step etching and the second step etching may adopt different dry or wet etching conditions. For example, the insulating layer 34 is firstly etched by a general dry etching gas for an oxide, and the oxide semiconductor layer 32 is then etched by a wet etching process of oxalic acid or aluminic acid. For the single step etching process or the multi-step etching process, the channel layer 38 should be covered by the insulating capping layer 37. It should be understood that a cross section of the line A-A' in FIG. 3D is shown in FIG. 3C or 4D.

FIGS. 3C and 4D show that a bottom surface of the insulating capping layer 37 and a top surface of the channel layer 38 have a substantially similar width. In other embodiments, the bottom surface of the insulating capping layer 37 can be slightly larger or smaller than the top surface of the channel layer 38, and the width difference therebetween is from 0 μm to 2 μm. Preferably, the bottom surface insulating capping layer 37 and the top surface of the channel layer 38 have identical widths. If the width difference therebetween is over 2 μm, it will be disadvantageous for following processes.

Subsequently, the passivation layer 52 is formed on the structure in FIG. 3C (or FIG. 4D). The passivation layer 52 can be silicon nitride, silicon oxide, silicon oxynitride, silicon carbide, aluminum oxide, titanium oxide, hafnium oxide, or multi-layered structures thereof. The passivation layer 52 can be formed by CVD, PECVD, or PVD process. In one embodiment, the structure surface in FIG. 3C (or FIG. 4D) is treated by reducing plasma (e.g. $H_2$ plasma) before forming the passivation layer 52, thereby enhancing the adhesion of the passivation layer 52. When the source/drain electrodes 16A/16B includes copper, the processes for defining the channel layer 38 such as a photolithography and an etching process may oxidize the source/drain electrodes 16A/16B surface. Accordingly, the copper oxide of the source/drain electrodes 16A/16B surface should be further reduced to copper by the reducing plasma or a reducing process (e.g. $H_2$). If the channel layer 38 is not covered by the insulating capping layer 37, the oxide semiconductor of the channel layer 38 will be reduced to a conductive material and the device function will be broken by the described reducing plasma and/or the reducing process.

Figure 5A:
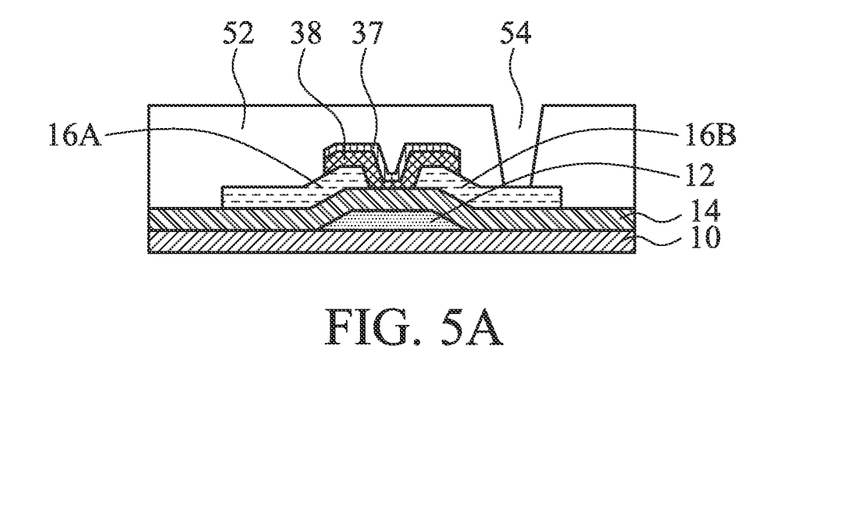
Figure 5B:
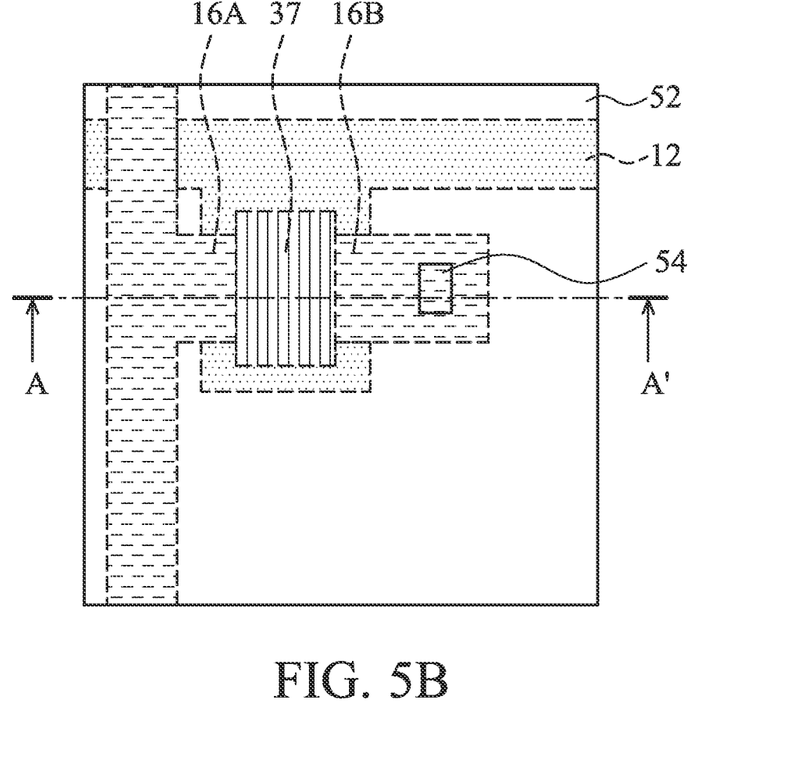

Next, a patterned photoresist layer (not shown) is formed on the passivation layer 52 by a photolithography process. The passivation layer 52 is then etched with the patterned photoresist layer serving as a mask, thereby forming a via hole 54 as shown in FIG. 5A. It should be understood that a cross section of the line A-A' in FIG. 5B is shown in FIG. 5A.

Figure 6A:
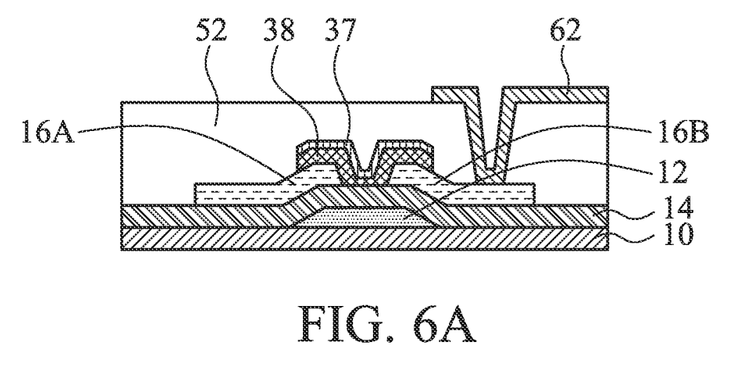
Figure 6B:
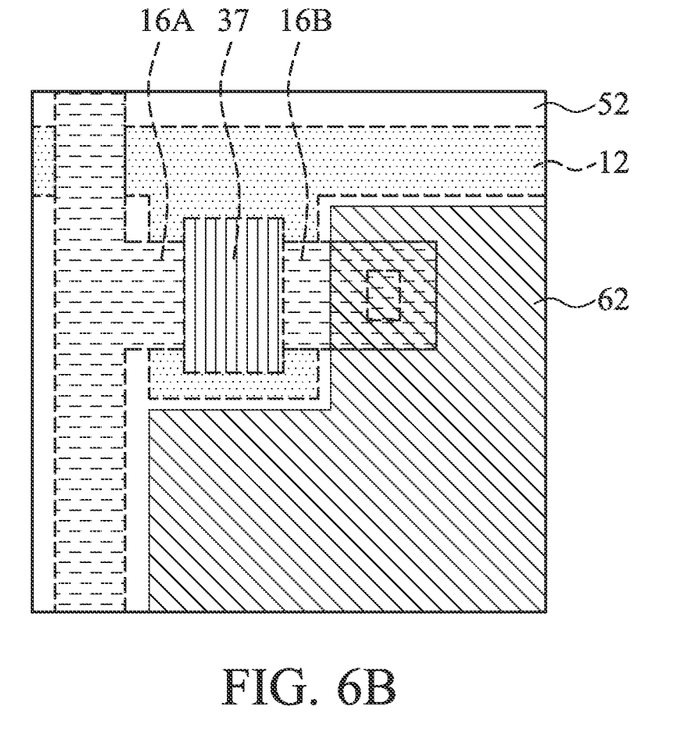

As shown in FIG. 6A, a conductive pattern 62 is formed on the structure in FIG. 5A. The conductive pattern 62 is formed on the passivation layer 52 to be a pixel electrode. Furthermore, the conductive pattern 62 electrically connects the drain electrode 16B through the via hole 54. The conductive pattern 62 can be formed by forming a conductive layer, and then patterning the conductive layer by a photolithography and an etching process to complete the TFT. If the TFT is applied in a transmissive LCD, the conductive pattern 62 includes indium tin oxide (ITO), indium zinc oxide (IZO), aluminum zinc oxide (AZO), cadmium tin oxide (CTO), tin oxide ($SnO_2$), zinc oxide (ZnO), or other transparent conductive materials. If the TFT is applied in a reflective LCD, the conductive pattern 62 includes aluminum, gold, tin, silver, copper, iron, lead, chromium, tungsten, molybdenum, neodymium, nitrides thereof, oxides thereof, oxynitrides thereof, alloys thereof, or combinations thereof. In addition, the reflective conductive pattern 62 has a rough surface to enhance the reflective and scattering effects of light. If the TFT is applied in a transflective LCD, the transparent material and the reflective material are adopted in transmissive regions and reflective regions thereof, respectively.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor, comprising:
    a gate electrode on a substrate, wherein the gate electrode includes a gate area with respect to the substrate;
    a channel layer overlapping the gate electrode, wherein the channel layer includes a channel area with respect to the substrate;
    a gate dielectric layer disposed between the gate electrode and the channel layer;
    a source electrode and a drain electrode electrically connected to two parts of the channel layer; and
    a passivation layer overlying the source electrode, the drain electrode, and the gate dielectric layer, wherein the passivation layer has a planar surface;
    a via hole through the passivation layer to expose a part of the drain electrode; and
    a conductive pattern on the planar surface of the passivation layer to serve as a pixel electrode, wherein the conductive pattern contacts the drain electrode through the via hole,
    wherein the channel layer comprises an oxide semiconductor, and
    wherein the channel area falls within the gate area.

2. The thin film transistor as claimed in claim 1, further comprising an insulating capping layer covering the channel layer.

3. The thin film transistor as claimed in claim 2, wherein a bottom surface of the insulating capping layer and a top surface of the channel layer have a substantially similar width.

4. The thin film transistor as claimed in claim 3, wherein the bottom surface of the insulating capping layer and the top surface of the channel layer have a width difference of 0 μm to 2 μm.

5. The thin film transistor as claimed in claim 1, wherein the source electrode and the drain electrode overlie two edge parts of the gate electrode.

6. The thin film transistor as claimed in claim 1, wherein the material of the gate dielectric layer is selected from a group consisting of silicon nitride, silicon oxide, silicon oxynitride, silicon carbide, aluminum oxide, hafnium oxide, or combinations thereof.

7. The thin film transistor as claimed in claim 1, wherein the material of the oxide semiconductor is selected from a group consisting of zinc oxide, indium oxide, indium gallium zinc oxide, tin oxide, or combinations thereof.

8. A display panel, comprising:
    a substrate;
    a thin film transistor on the substrate, comprising:
    a gate electrode, wherein the gate electrode includes a gate area respect to the substrate;
    a channel layer overlapping the gate electrode, wherein the channel layer includes a channel area respect to the substrate;
    a gate dielectric layer disposed between the gate electrode and the channel layer;
    a source electrode and a drain electrode electrically connecting two parts of the channel layer;
    a passivation layer overlying the source electrode, the drain electrode, and the gate dielectric layer, wherein the passivation layer has a planar surface;
    a via hole through the passivation layer to expose a part of the drain electrode; and
    a conductive pattern on the planar surface of the passivation layer to serve as a pixel electrode, wherein the conductive pattern contacts the drain electrode through the via hole,
    wherein the channel layer comprises an oxide semiconductor, and
    wherein the channel area falls in the gate area.

9. The display panel as claimed in claim 8 further includes an insulating capping layer covering the channel layer.

10. The display panel as claimed in claim 9, wherein a bottom surface of the insulating capping layer and a top surface of the channel layer have a substantially similar width.

11. The display panel as claimed in claim 10, wherein the bottom surface of the insulating capping layer and the top surface of the channel layer have a width difference of 0 μm to 2 μm.

12. The display panel as claimed in claim 8, wherein the source electrode and the drain electrode overlie two edge parts of the gate electrode.

13. The display panel as claimed in claim 8, wherein the material of the gate dielectric layer is selected from a group consisting of silicon nitride, silicon oxide, silicon oxynitride, silicon carbide, aluminum oxide, hafnium oxide, or combinations thereof.

14. The display panel as claimed in claim 8, wherein the material of the oxide semiconductor is selected from a group consisting of zinc oxide, indium oxide, indium gallium zinc oxide, tin oxide, or combinations thereof.

* * * * *